(12) United States Patent
Ma

(10) Patent No.: US 9,070,809 B2
(45) Date of Patent: Jun. 30, 2015

(54) INTER-FACING SOLAR PANELS

(76) Inventor: Feng Ma, Cary, NC (US)

( * ) Notice: Subject to any disclaimer, the term of this patent is extended or adjusted under 35 U.S.C. 154(b) by 937 days.

(21) Appl. No.: 12/527,557

(22) PCT Filed: Feb. 15, 2008

(86) PCT No.: PCT/US2008/054172
§ 371 (c)(1),
(2), (4) Date: Aug. 17, 2009

(87) PCT Pub. No.: WO2008/101218
PCT Pub. Date: Aug. 21, 2008

(65) Prior Publication Data
US 2010/0116317 A1    May 13, 2010

Related U.S. Application Data

(60) Provisional application No. 60/890,159, filed on Feb. 15, 2007.

(51) Int. Cl.

| | |
|---|---|
| *H01L 31/052* | (2014.01) |
| *H01L 31/045* | (2006.01) |
| *H01L 31/055* | (2014.01) |
| *H02S 30/20* | (2014.01) |
| *H02S 40/44* | (2014.01) |
| *H01L 31/054* | (2014.01) |
| *F24J 2/16* | (2006.01) |
| *F24J 2/18* | (2006.01) |
| *F24J 2/36* | (2006.01) |

(52) U.S. Cl.
CPC ......... *H01L 31/055* (2013.01); *Y10T 29/49826* (2015.01); *F24J 2/16* (2013.01); *F24J 2/18* (2013.01); *F24J 2/36* (2013.01); *Y02E 10/52* (2013.01); *Y02E 10/60* (2013.01); *H02S 30/20* (2014.12); *H02S 40/44* (2014.12); *H01L 31/0547* (2014.12)

(58) Field of Classification Search
CPC ... H01L 31/055; H01L 31/0547; H02S 30/20; H02S 40/44; F24J 2/16; F24J 2/18; F24J 2/36; Y10T 29/49826; Y02E 10/52; Y02E 10/60
USPC .......................................... 136/243–245, 251
See application file for complete search history.

(56) References Cited

U.S. PATENT DOCUMENTS

| | | | | |
|---|---|---|---|---|
| 2001/0008144 | A1* | 7/2001 | Uematsu et al. | 136/246 |
| 2003/0047207 | A1* | 3/2003 | Aylaian | 136/244 |
| 2004/0103937 | A1* | 6/2004 | Bilyalov et al. | 136/255 |
| 2005/0045224 | A1* | 3/2005 | Lyden | 136/291 |
| 2006/0180194 | A1* | 8/2006 | Mitsunari | 136/244 |
| 2006/0225778 | A1* | 10/2006 | Brabec et al. | 136/244 |
| 2007/0017566 | A1* | 1/2007 | Gaudiana et al. | 136/245 |
| 2007/0199591 | A1* | 8/2007 | Harder et al. | 136/252 |

\* cited by examiner

*Primary Examiner* — Matthew Martin
(74) *Attorney, Agent, or Firm* — Syncoda LLC; Feng Ma

(57) ABSTRACT

A method for effectively collecting solar energy, including disposing solar panels substantially inter-facing each other, and reflecting sun light between inter-facing solar panels. A solar panel, including a first portion adapted to convert sun light into usable energy at a first optimal wavelength; and a second portion adapted to convert sun light into usable energy at a second optimal wavelength. A method for effectively collecting solar energy, including using a first portion of a first solar panel to partially convert a beam of sun light into usable energy, and partially reflect the beam of sun light into a second solar panel; and using the second solar panel to partially convert the reflected beam into collectable energy.

20 Claims, 6 Drawing Sheets

INTER-FACING SOLAR PANELS

BACKGROUND OF INVENTION

Solar panels are used widely to generate electricity or to generate heat directly. Conventional solar panels are positioned facing the sun, as illustrated in FIG. 1. Referring to FIG. 1, a solar panel array 100 may include a plurality of solar panels 101a, 101b, . . . . The individual solar panels are usually positioned substantially in a same plane that substantially faces the sun 103. To maximize the efficiency of collecting solar energy, it is usually preferred that the solar panels are as vertical to the sun light direction 102 as possible. In some prior art, the solar panels are driven, using motors, to follow the sun. A significant portion of sun light is reflected back to the space, as shown by arrow 104. Anti-reflecting (AR) coatings have been used to lower the reflection.

SUMMARY OF INVENTION

In one aspect, embodiments disclosed herein relate to a method for effectively collecting solar energy, including disposing solar panels substantially inter-facing each other, and reflecting sun light between inter-facing solar panels.

In another aspect, embodiments disclosed herein relate to a solar panel, including a first portion adapted to convert sun light into usable energy at a first optimal wavelength; and a second portion adapted to convert sun light into usable energy at a second optimal wavelength.

In another aspect, embodiments disclosed herein relate to a method for effectively collecting solar energy, including using a first portion of a first solar panel to partially convert a beam of sun light into usable energy, and partially reflect the beam of sun light into a second solar panel; and using the second solar panel to partially convert the reflected beam into collectable energy.

Other aspects and advantages of the invention will become apparent from the following description and the attached claims.

DETAILED DESCRIPTION

Embodiments of the present invention are described in detail below with respect to the drawings. Like reference numbers are used to denote like parts throughout for consistency.

In one aspect, some embodiments disclosed herein relate to methods and systems for effectively collecting solar energy using solar panels that allow sun light to be reflected between the panels.

Figure 1:
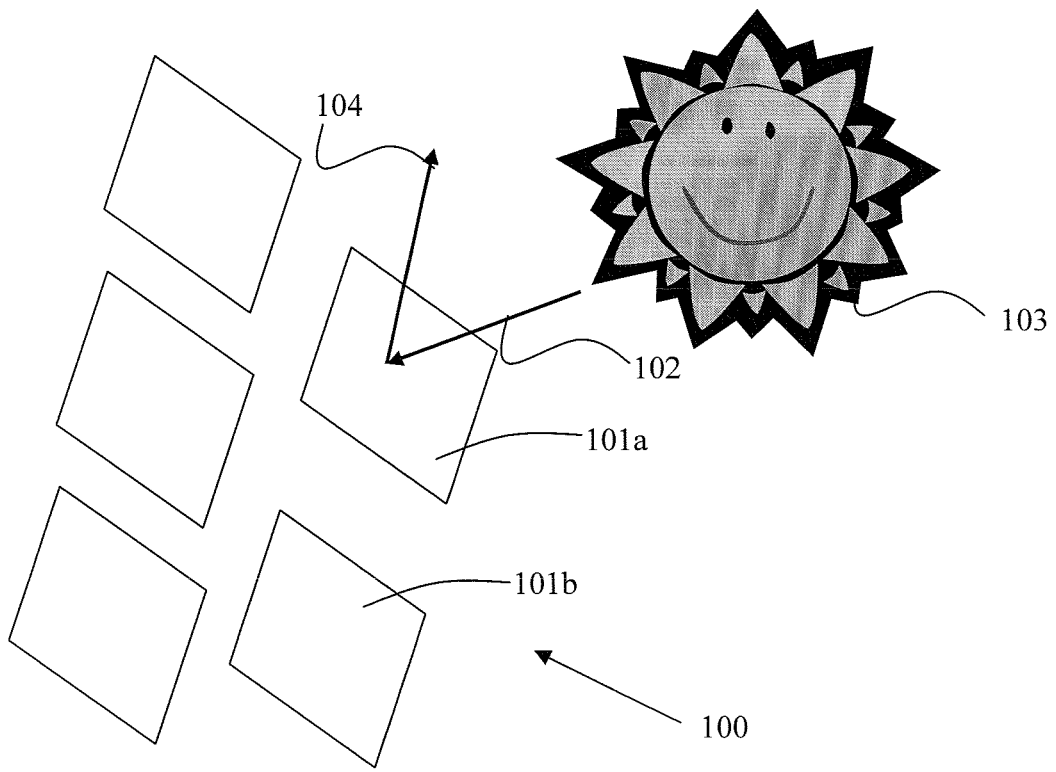
FIG. 1 illustrates a conventional solar panel array.
Figure 2:
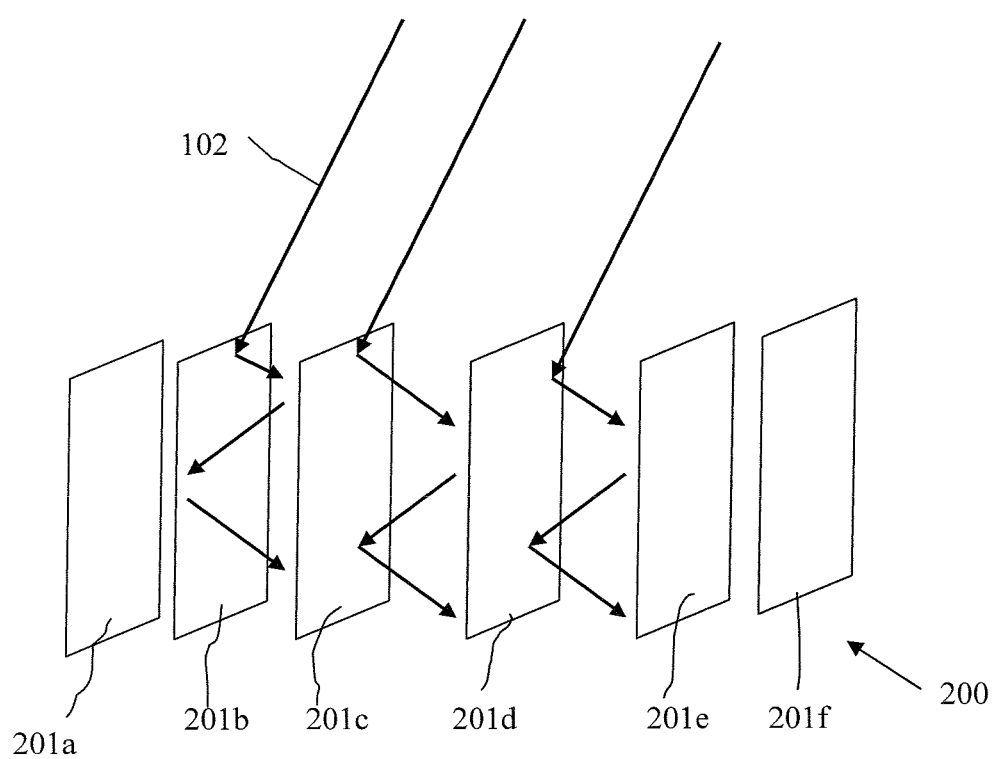
FIG. 2 shows a solar panel array in accordance with an embodiment of the invention.

Referring to FIG. 2, a solar panel array 200 in accordance with an embodiment of the invention includes a plurality of solar panels 201a, 201b, . . . , 201f. A sunlight beam 102, for example, impinges on a solar panel 201b, and is partially absorbed and the energy is converted to, e.g., electricity, and is partially reflected to, e.g., another solar panel 201c. The light may be reflected back and forth many times, and is more efficiently collected. Unlike conventional solar panels, both sides of solar panels such as 201c in FIG. 2 are coated with active material, such as compound semiconductor based, or organic-material based, photovoltaic layers. AR coatings are not needed for these solar panels.

Although the solar panels in FIG. 2 are shown to be substantially parallel to each other, in accordance with some embodiments of the invention, the solar panels are not necessarily parallel to each other so long as they are substantially inter-facing such that sunlight reflected off one solar panel may be received by another solar panel.

Figure 3A:
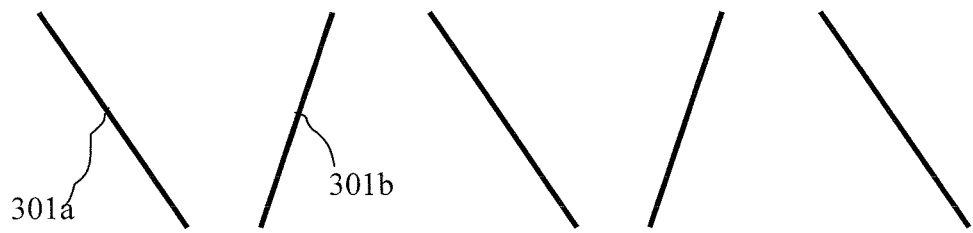
FIGS. 3A-3C illustrates different arrangements of solar panels in accordance with embodiments of the invention.

For example, shown in FIG. 3A, solar panels 301a, 301 b, . . . , viewed from the side, have an angle therebetween. The angle between neighboring solar panels 301a and 301b are preferably less than 90° to allow a significant portion of sunlight being reflected off on a surface of a solar panel 301a to be received by, e.g., another solar panel 301b.

Figure 3B:
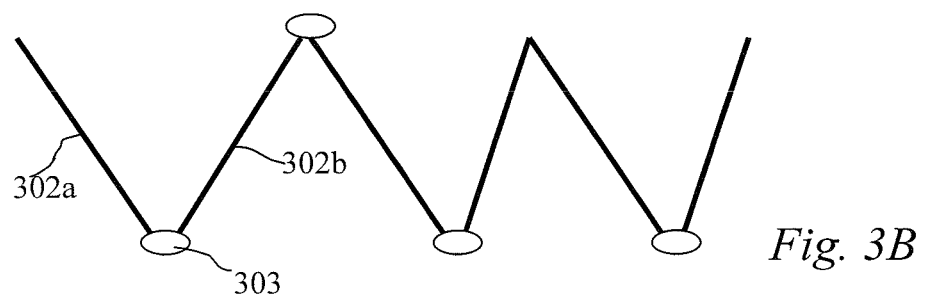

In accordance with some embodiments of the invention, shown in FIG. 3B, a plurality of solar panels 302a, 302b, . . . , are joined by, e.g., a hinge, a connector, or any other means known in the art, such that the solar panels can be compressed when are not in use, and extended when in use. The solar panels may optionally be removed from the joints and become individual solar panels.

Figure 3C:
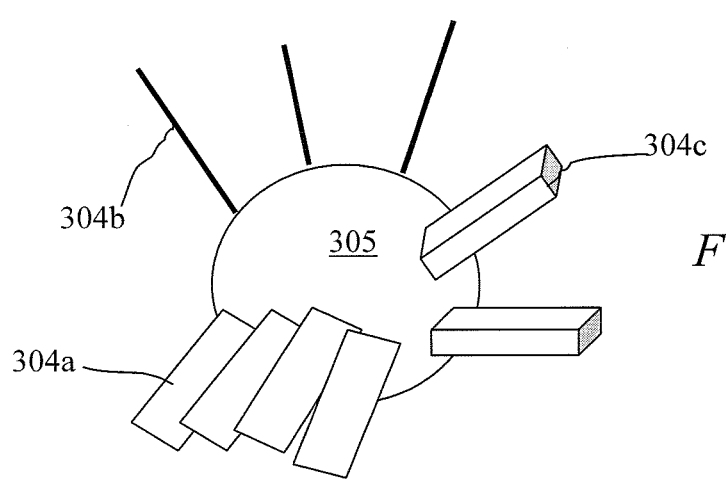

In accordance with some embodiments of the invention, shown in FIG. 3C, a plurality of solar panels 304a, 304b, . . . , are disposed on a surface 305. The surface 305 may be spherical, cylindrical, or of any other shapes that allow an improved usage of space or areas. The solar "panels" are not necessarily two-dimensional plates having both sides coated with active layers. Rather, a solar "panel" such as 304c may have there-dimensional shapes with more than two surfaces coated with active layers.

Figure 4:
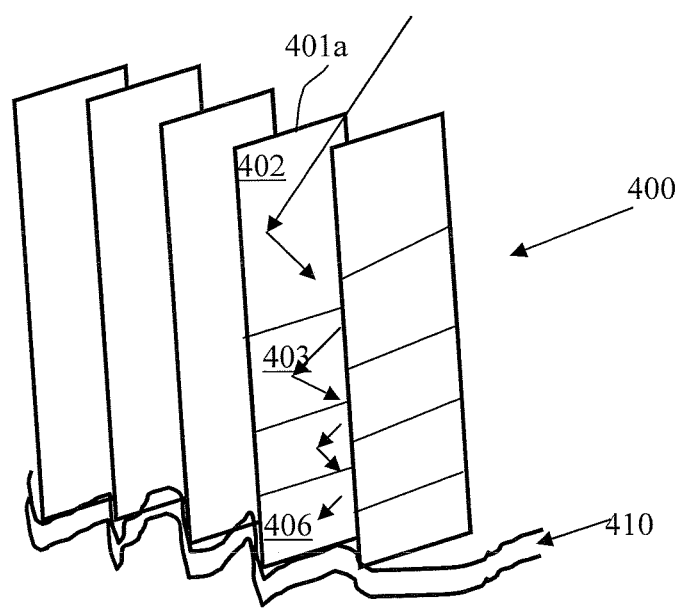
FIG. 4 shows a solar panel array including solar panels having different portions responding to different wavelengths in accordance with embodiments of the invention.

In accordance with some embodiments of the invention, shown in FIG. 4, a solar panel array 400 includes solar panels, e.g., 401a that has a plurality of portions 402, 403, . . . , that are optimized for collecting solar energy at different wavelengths. For example, the first portion 402 may be optimized for converting UV light to electricity, and the second portion 403 may be optimized for converting sunlight at a longer wavelength to electricity, and other portions such as 406 is mainly responsible for converting infrared light or heat into usable energy.

When converting heat to usable energy, a portion 406 of the solar panel 401a may use the conventional method, such as heating a liquid or gas, and the heated liquid or gas can be used. In addition, the heat may be converted to electricity, e.g., through the Seebeck effect.

In accordance with some embodiments of the invention, the solar panel array 400 in FIG. 4 may be combined with a pipe or duct or tube 410, in which a cooling agent, such as water, flows. Not only the cooling agent cools the solar panels to improve the solar energy collection efficiency, the heat collected by the cooling agent may also be used, for example, to heat household water.

Figure 5:
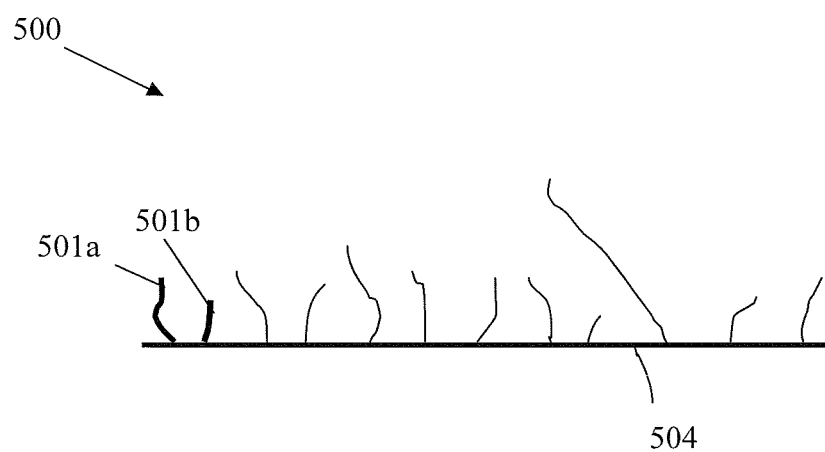
FIG. 5 shows a system for collecting solar energy in accordance with an embodiment of the invention including a plurality of irregular-shaped solar panels.

In accordance with some embodiments of the invention, a solar panel array 500, shown in FIG. 5, include a plurality of irregular-shaped solar "panels" 501a, 501b, . . . . These "panels" may be grown on, e.g., a building top surface 504. The shapes of these "panels" may be grown in a self-organized fashion, taking advantage of low-cost material growth technology, while maximizing reception surface area and taking advantage of reflected sunlight.

In accordance with some embodiments of the invention, the reflection surfaces are made of porous structures to increase the area of the solar-power collecting surface and to take advantages of reflected sunlight.

Figure 6:
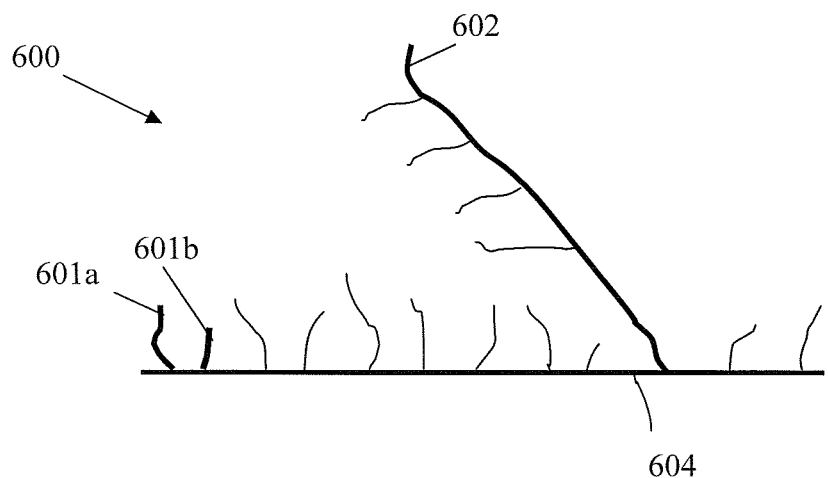
FIG. 6 shows a system for collecting solar energy in accordance with an embodiment of the invention including a plurality of irregular-shaped solar panels and a "master" panel.

In accordance with some embodiments of the invention, shown in FIG. 6, the system 600 includes a "master" panel 602, which together with a surface 604 are primarily responsible for reflecting light back and forth to allow smaller panels 601a, 601b, . . . to absorb the light. In accordance with some embodiments of the invention, the "master" panel 602 itself may have active layers to absorb sunlight. In accordance with some other embodiments of the invention, the "master" panel 602 only serves as a reflective surface. A plurality of smaller "panels" with active solar-energy converting layers may additionally be grown on the master panel 602.

Similar to the system of FIG. 4, cooling water may be circulated near or underneath the surfaces 602 and 604.

The solar panels discussed above are not limited to solar cells for converting sunlight to electricity. Solar panels that collect heat using circulating fluid or gas in, e.g., tubes on the panels can also take advantage of the present invention.

Advantages of one or more embodiments of the present invention may include, but are not limited to: improved collection efficiency; minimized space; no need for AR coating. Solar panels in accordance with embodiments of the invention may be installed, e.g., on building surfaces, ships, automobiles, balloons, or on spacecrafts.

While the invention has been described with respect to a limited number of embodiments, those skilled in the art, having benefit of this disclosure, will appreciate that other embodiments can be advised which do not depart from the scope of the invention as disclosed herein. Accordingly, the scope of the invention should be limited only by the attached claims.

What is claimed is:

1. An apparatus configured to collect solar energy, the apparatus comprising:
    a reflective surface;
    a plurality of elements each configured to convert solar energy to electricity or collectable energy and disposed on the reflective surface,
    wherein at least two adjacent elements among the plurality of elements each have a reflection surface and an energy collection surface,
    wherein one of the at least two reflection surfaces is configured to reflect sun light to another one of the at least two reflection surfaces for partial absorption and conversion to electricity or collectable energy by the energy collection surface located on the adjacent element,
    wherein one of the at least two reflection surfaces comprises a porous structure configured to increase a solar energy collecting surface area and the partial absorption of the reflected sun light,
    wherein the plurality of elements include at least one master panel disposed at the reflective surface and a plurality of smaller elements grown on the at least one master panel, wherein the plurality of smaller elements include a plurality of active solar energy converting layers having irregular three-dimensional shapes; and
    wherein the master panel and the reflective surface are configured to reflect sun light back and forth to allow the smaller elements to absorb the reflected sun light.

2. The apparatus of claim 1,
    wherein a relative angle between the two adjacent elements is less than 90 degrees; and
    wherein the master panel only serves as a reflective surface.

3. The apparatus of claim 2, wherein the relative angle is adjustable.

4. The apparatus of claim 3, wherein at least a subset of the plurality of elements are removably coupled together, and wherein the subset of the plurality of elements are foldable and extendable.

5. The apparatus of claim 1,
    wherein at least a subset of the plurality of elements are disposed over a cylindrical or spherical surface to allow improved usage of space, and
    wherein the subset of the plurality of elements each have an active side substantially along a radial direction of the cylindrical or spherical surface.

6. The apparatus of claim 1,
    wherein the plurality of elements include a plurality solar panels having irregular three-dimensional shapes.

7. The apparatus of claim 1, wherein each of the plurality of elements comprises at least one of a heat collecting element, a photovoltaic solar cell, or a photoconductive solar cell.

8. The apparatus of the claim 1, wherein at least one of the plurality of elements comprises a plurality of portions, and wherein each of the plurality of portions has an optimal solar energy collecting efficiency for a specified wavelength of direct or reflected sun light.

9. The apparatus of claim 1, further comprising a cooling unit configured to lower a temperature of the apparatus.

10. The apparatus of claim 9, wherein the cooling unit is configured to collect thermal energy from at least a subset of the plurality of elements.

11. The apparatus of claim 10, wherein the cooling unit comprises a circulating cooling agent configured to cool the apparatus and to collect the thermal energy.

12. The apparatus of claim 1, wherein each of the plurality of elements comprises a solar panel, wherein the plurality of solar panels are disposed substantially vertical to a surface and substantially facing each other such that a first of the plurality of solar panels is configured both to partly absorb and convert sun light to electricity or collectable thermal energy and to partly reflect sun light to a second of the plurality of solar panels, wherein the reflected sun light is further absorbed and converted to electricity or collectable thermal energy by the second solar panel, wherein the first and second solar panels are configured to reflect sun light back and forth multiple times, wherein the first and second solar panels each comprise a plurality of portions, and wherein each of the plurality of portions has an optimal solar energy collecting efficiency for a wavelength corresponding to a number of reflections along the plurality of portions toward the surface.

13. The apparatus of claim 1, wherein each of the plurality of elements comprises a solar panel, and wherein each of the plurality of solar panels does not have an anti-reflection (AR) coating.

14. The apparatus of claim 6, wherein each of the plurality of elements comprises a solar panel, and wherein both sides of each of the plurality of solar panels are configured to partially absorb and convert sun light into electricity or collectable solar energy and to partially reflect sun light toward other solar panels, wherein the partially reflected sun light is further absorbed and converted to electricity or collectable thermal energy by the other solar panels, and wherein the irregular three-dimensional shapes are formed by self-organized growth.

15. The apparatus of claim 1, wherein each of the plurality of elements has more than two surfaces each having active layers configured to convert sun light into electricity or collectable thermal energy.

16. The apparatus of claim 1, wherein the master panel further comprises an active layer to absorb the sun light.

17. A system configured to collect solar energy, the system comprising a reflective surface, and a plurality of elements each configured both to partially absorb and convert sun light into usable energy and to partially reflect sun light at a reflection surface, wherein at least one of the plurality of elements comprises:
- a first portion configured to convert sun light into usable energy at a first optimal wavelength for energy collection efficiency of direct sun light; and
- a second portion configured to convert reflected sun light into usable energy at a second optimal wavelength for energy collection efficiency for the reflected sun light,
- wherein each of the plurality of reflection surfaces comprises a porous structure,
- wherein the porous structure is configured to increase a solar energy collecting surface area and the partial absorption of the reflected sun light;
- wherein the plurality of elements include at least one master panel disposed at the reflective surface and a plurality of smaller elements grown on the at least one master panel, wherein the plurality of smaller elements include a plurality of active solar energy converting layers having irregular three-dimensional shapes; and
- wherein the master panel and the reflective surface are configured to reflect sun light back and forth to allow the smaller elements to absorb the reflected sun light.

18. A method for collecting solar energy, comprising:
- with a reflection surface of a first portion of a first element, partially converting a beam of sun light into usable energy, and partially reflecting the beam of sun light toward a second element; and
- with the second element, partially converting the reflected beam of sun light into collectable energy,
- wherein the reflection surface has a porous structure configured to improve efficiency for collecting the solar energy by increasing a solar energy collecting surface area and the partial conversion of the reflected sun light;
- wherein the first and second elements are part of a plurality of elements including at least one master panel disposed at a reflective surface and a plurality of smaller elements grown on the at least one master panel, wherein the plurality of smaller elements include a plurality of active solar energy converting layers having irregular three-dimensional shapes;
- the method further comprising:
    - reflecting sun light back and forth between at least one master panel and the reflective surface to allow a plurality of smaller elements disposed over the master panels to absorb the reflected sun light.

19. The method of claim 18, further comprising:
- with the second element, partially reflecting the reflected beam to a second portion of the first element; and
- with the second portion of the first element further partially converting the twice-reflected beam into usable energy,
- wherein the second portion and the first portion are configured to convert sun light into usable energy at different optimal wavelengths.

20. The method of claim 18, further comprising disposing at least two solar panels substantially facing each other, such that at least a portion of reflected sunlight from one of the at least two solar panels at least partially impinges on another one of the at least two solar panels wherein the at least two solar panels have irregular three-dimensional shapes formed by a self-organized growth.

* * * * *